United States Patent [19]

Vasseghi et al.

[11] Patent Number: 4,678,940

[45] Date of Patent: Jul. 7, 1987

[54] TTL COMPATIBLE MERGED BIPOLAR/CMOS OUTPUT BUFFER CIRCUITS

[75] Inventors: Nader Vasseghi, Mountain View; Donald G. Goddard, Cupertino; Robert E. Eccles, Santa Clara, all of Calif.

[73] Assignee: Advanced Micro Devices, Inc., Sunnyvale, Calif.

[21] Appl. No.: 817,228

[22] Filed: Jan. 8, 1986

[51] Int. Cl.[4] .................. H03K 19/08; H03K 19/003; H03K 17/16; H03K 17/56

[52] U.S. Cl. .................................... 307/446; 307/570; 307/473; 307/456; 307/451; 307/443

[58] Field of Search ............... 307/443, 456, 473, 475, 307/570, 446, 571, 270, 280, 300, 254, 255, 451

[56] References Cited

U.S. PATENT DOCUMENTS 4,612,458  9/1986  Vasseghi et al. ..................... 307/446
4,616,146 10/1986  Lee et al. ............................ 307/446
4,638,186  1/1987  McLaughlin ....................... 307/446

FOREIGN PATENT DOCUMENTS 0099100  1/1984  European Pat. Off. ............ 307/446
0028726  2/1984  Japan .................................. 307/446

OTHER PUBLICATIONS

Changlin, "Complementary MOS-Bipolar Transistor Structure", IEEE Transactions on Electron Devices, vol. ED-16, No. 11, pp. 945-951, Nov. 1969.

Primary Examiner—Stanley D. Miller
Assistant Examiner—David R. Bertelson
Attorney, Agent, or Firm—Patrick T. King; Davis Chin; J. Vincent Tortolano

[57] ABSTRACT

Output buffer circuits formed of merged bipolar transistor and CMOS transistors to produce either two output states or three output states includes a plurality of CMOS transistors and a pair of bipolar transistors. The output buffer circuits have high current drive capabilities and low propagation delay.

25 Claims, 6 Drawing Figures

TTL COMPATIBLE MERGED BIPOLAR/CMOS OUTPUT BUFFER CIRCUITS

BACKGROUND OF THE INVENTION

This invention relates generally to output buffer circuits and more particularly, it relates to a composite bipolar/CMOS output buffer circuit having high current drive capabilities and low propagation delay which is compatible with TTL levels.

Conventional output buffer circuits employing CMOS transistors are generally well known in the prior art. The major disadvantage with CMOS transistor technology is that they have a low current drive capability which is unsuitable for large capacitive loads. While the CMOS output buffer circuits of the prior art have been modified to use very large output transistors in order to increase the current drive for TTL level compatibility, this has resulted in the problem of causing substantial propagation delay in its output.

It would therefore be desirable to provide a merged bipolar/CMOS output buffer circuit which has the advantages of high current drive capability and low propagation delay. The present invention is achieved by combining the bipolar transistor and CMOS transistor technologies together. As a result, bipolar transistors and CMOS transistors are merged or are arranged in a common semiconductor substrate to form an integrated circuit output buffer device.

SUMMARY OF THE INVENTION

Accordingly, it is a general object of the present invention to provide a merged bipolar/CMOS output buffer circuit which is relatively simple and economical to manufacture and assemble, but yet overcomes the disadvantages of the conventional output buffer devices.

It is an object of the present invention to provide a merged bipolar/CMOS output buffer circuit which has high current drive capability and low propogation delay.

It is another object of the present invention to provide an output buffer circuit formed of merged bipolar transistors and CMOS transistors which provides two output states compatible with TTL levels.

It is still another object of the present invention to provide an output buffer circuit formed of merged bipolar transistors and CMOS transistors which provides three distinct output states compatible with TTL levels.

In accordance with these aims and objectives, the present invention is concerned with the provisions of an output buffer circuit formed of merged bipolar transistors and CMOS transistors to provide two output states which are compatible with TTL levels. The output buffer circuit includes a P-channel MOS transistor having its gate connected to an input terminal and its source connected to a supply potential. A first bipolar transistor has its collector connected to the supply potential, its base connected to the drain of the P-channel transistor, and its emitter connected to an output terminal. A first N-channel MOS transistor has its gate connected to the input terminal and its drain connected to the supply potential. A second bipolar transistor has its collector connected to the output terminal, its base connected to the source of the first N-channel transistor via a resistor, and its emitter connected to a ground potential. A second N-channel MOS transistor has its gate connected to the drain of the P-channel transistor, its drain connected to the source of the first N-channel transistor, and its source connected to the ground potential. A third N-channel MOS transistor has its gate connected to the input terminal, its drain connected to the drain of the P-channel transistor, and its source connected to the ground potential. A third bipolar transistor has its base connected to the source of the first N-channel transistor, its collector connected to the base of the second bipolar transistor, and its emitter connected to the collector of the second bipolar transistor.

In another aspect of the present invention, an output buffer circuit is provided which has three distinct output states and is formed of a plurality of CMOS transistors and a plurality of bipolar transistors.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
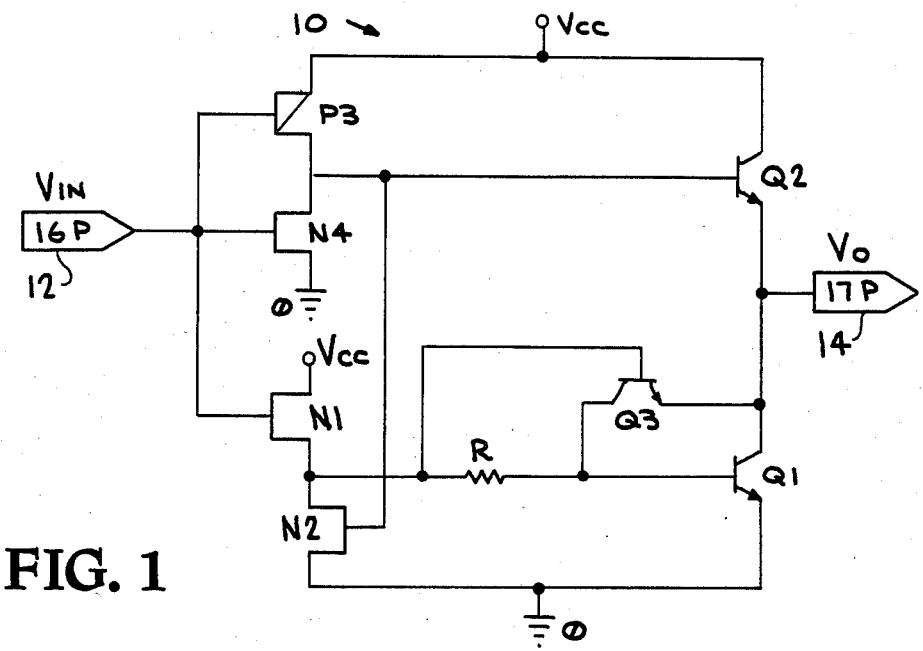
FIG. 1 is a schematic circuit diagram of a merged bipolar/CMOS output buffer circuit having two output states constructed in accordance with the principles of the present invention.

Referring now in detail to the drawings, there is shown in FIG. 1 a schematic circuit diagram of a merged bipolar/CMOS (complementary metal-oxide-semiconductor) output buffer device 10 of the present invention which provides two output states compatible with TTL levels. The output buffer 10 has an input terminal 12 and an output terminal 14. The buffer device functions to translate CMOS logic levels received at the input terminal 12 to TTL logic levels at the output terminal 14 with increased current drive capability and thus shorter propagation delay.

The buffer device 10 includes an N-channel MOS transistor N1, a P-channel MOS transistor P3, a first discharge N-channel MOS transistor N2, a second discharge N-channel MOS transistor N4, a pull-down bipolar transistor Q1 and a pull-up bipolar transistor Q2. Anti-saturation means for controlling the saturation effects of the pull-down bipolar transistor Q1 comprises a bipolar transistor Q3 and a resistor R. For convenience, it will be noted that the P-channel transistor has been identified by the letter P followed by a particular reference numeral, and the N-channel MOS transistors have been identified by the letter N followed by a particular reference.

The N-channel MOS transistor N1 has its drain electrode connected to a supply voltage or potential VCC, its source electrode connected to the drain of the first discharge transistor N2, and its gate electrode connected to the input terminal 12. The supply potential VCC is typically at +5.0 volts. The input terminal 12 receives an input logic signal $V_{IN}$ which swings between a low or "0" logic state and a high or "1" logic. For CMOS input logic levels, the low state is approximately zero volts and the high state is approximately the supply potential VCC or +5.0 volts. The P-channel MOS transistor P3 has its source electrode connected to the supply potential, and its drain connected to the drain of the second discharge transistor N4 and its gate connected to the input terminal 12.

The pull-down bipolar transistor Q1 has its collector connected to the emitter of the pull-up bipolar transistor Q2 and to the output terminal 14. The emitter of the bipolar transistor Q1 is connected to the source of the second discharge transistor N2 and to a ground potential. The base of the transistor Q1 is connected to one end of the resistor R and to the collector of the saturation control transistor Q3. The other end of the resistor R is connected to the source of the N-channel transistor N1, the drain of the first discharge transistor N2, and the base of the saturation control transistor Q3. The emitter of the transistor Q3 is connected to the collector of the pull-down bipolar resistor Q1. The collector of the pull-up bipolar transistor Q2 is connected to the supply potential VCC. The base of the transistor Q2 is connected to the drains of the transistors P3 and N4 and to the gate of the transistor N2. The source of the second discharge transistor N4 is connected to the ground potential, and the base of the transistor N4 is connected to the input terminal 12.

The bipolar transistor Q1 defines a current sink transistor and operates as a pull-down device. The bipolar transistor Q2 defines a current source transistor and operates as a pull-up device. These transistors Q1 and Q2 are operated in what is commonly known as a "push/pull" fashion. The bipolar transistors have the advantage over the CMOS transistors in that the former has the ability of providing higher current source/sink capabilities used for driving capacitive output loads.

The anti-saturation means consisting of the saturation control transistor Q3 and the resistor R is utilized for controlling the saturation of the pull-down bipolar transistor Q1, thereby eliminating the need of a Schottky diode. Therefore, the fabrication process complexity for the output buffer device 10 is minimized and thus cost is reduced. When the transistor Q1 enters into the saturation region, the collector-emitter voltage thereof reduces the pulling-down of the output voltage $V_O$ at the output terminal 14. The base-to-emitter voltage $V_{BE(Q3)}$ drop across the transistor Q3 will be equal to the sum of the base-to-emitter voltage $V_{BE(Q1)}$ drop across the transistor Q1 and the voltage $V_R$ drop across the resistor R less the output voltage $V_O$ or $V_{BE(Q1)} + V_R - V_O$. By selecting the resistance value of the resistor R and the geometry of the transistors Q3 and Q1 so that before the transistor Q1 enters into the hard saturation region, the saturation control transistor Q3 will conduct to divert the current from the base of the transistor Q1 through the transistor Q3 to the collector of the transistor Q1, thereby preventing the transistor Q1 from being forced further into the saturation region. As a result, excess storage charge at the base of the transistor Q1 is reduced so as to permit an increased switching speed of operation.

The N-channel transistor N2 provides a discharge path from the base of the bipolar transistor Q1 so as to quickly turn off the same, thereby facilitating and speeding up the low-to-high transition at the output terminal 14. The N-channel transistor N4 provides a discharge path from the base of the bipolar transistor Q2 so as to quickly turn off the same, thereby facilitating and speeding up the high-to-low transition at the output terminal 14. It should be understood to those skilled in the art that the output buffere device 10 may be formed on a single silicon chip of a monolithic integrated circuit. Further, it will be noted that while the bipolar transistors Q1, and Q2 and Q3 are all of the NPN-type conductivity these transistors may be replaced with the PNP-type.

Now the operation of the output buffer deivce 10 of this invention constructed as described above will be explained. Assume that the input logic signal $V_{IN}$ is at a low or "0" state, the P-channel MOS transistor P3 will be in the conductive state and the N-channel MOS transistor N1 will be rendered non-conductive. With the transistor P3 being conductive, there is provided drive current to the base of the bipolar transistor Q2 so as to turn on the same for pulling up the output voltage. As a result, the output terminal 14 will begin to quickly charge up towards the high or "1" state. This output voltage $V_O$ in the high state will be equal to the supply potential VCC less the sum of the voltage drop $V_{(P3)}$ across the channel of the MOS transistor P3 and the base-to-emitter voltage $V_{BE(Q2)}$ across the bipolar transistor Q2. Generally, the voltage $V_{(PE)}$ is about +0.2 volts and the voltage $V_{BE(Q2)}$ is about +0.8 volts. Thus, the output voltage $V_O$ in the high state will be approximately +4.0 volts.

When the input logic signal $V_{IN}$ at the input terminal 12 switches from the low level state and increases above the sum of the threshold voltages of the transistors N1 and Q1 or $V_{T(N1)} + V_{BE(Q1)}$, the transistors N1 and Q1 will begin to be rendered conductive for pulling down the output voltage at the output terminal 14. As a result, the output voltage $V_O$ will be pulled down to the low or "0" state. This output voltage $V_O$ in the low state will be equal to the collector-to-emitter voltage $V_{CE(Q1)}$ drop across the transistor Q1.

For a low-to-high transition at the input terminal 12, it is necessary to turn off the transistor Q2 as quickly as possible when the transistor Q1 is being turned on so as to reduce delay in the high-to-low transition at the output terminal 14. Since the transistor N4 turns on quickly when the input signal is in the high state due to the fact that its gate is pulled up, there will exist a conductive discharge path from the base of the transistor Q2 to ground for discharging of its excess base charge. For a high-to-low transition at the input terminal 12, it is necessary to turn off the transistor Q1 as quickly as possible when the transistor Q2 is being turned on so as to reduce delay in the low-to-high transition at the output terminal 14. Since the transistor N2 turns on quickly when the input signal is in the low state due to the fact that its gate is pulled up through the transistor P3, there will exist a conductive discharge path from the base of the transistor Q1 to ground for discharging of its excess base charge.

Figure 2:
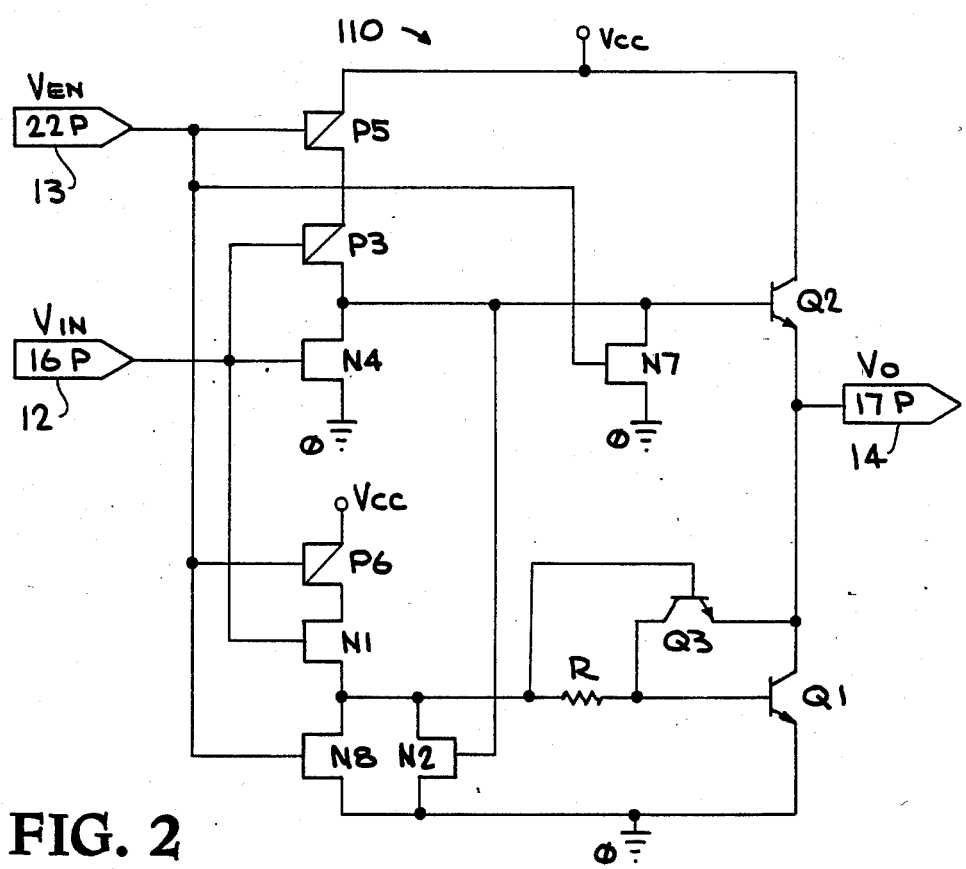
FIG. 2 is a schematic circuit diagram of a merged bipolar/CMOS output buffer circuit of the present invention which provides three distinct output states.

In FIG. 2, there is shown a schematic circuit diagram of a merged bipolar/CMOS output buffer device 110 of the present invention which provides three distinct output states compatible with TTL levels. The output buffer device 110 of FIG. 2 includes all of the components of the buffer device 10 of FIG. 1 and further includes two additional enable P-channel MOS transistors P5, P6 and two additional discharge N-channel MOS transistors N7, N8. All of the components in FIG. 2 which are identical to those of FIG. 1 have been designated by the same reference numerals. Since the differences between FIG. 1 and FIG. 2 reside in the connection of the four MOS transistors P5, P6, N7 and N8, only these connections will now be explained.

Specifically, the enable P-channel transistor P5 has its source electrode connected to the supply potential VCC, its drain electrode connected to the source electrode of the P-channel transistor P3, and its gate electrode connected to a second input terminal 13. The second input terminal 13 receives an enable signal $V_{EN}$ which swings between a low state and a high state. The enable P-channel transistor P6 has its source electrode also connected to the supply potential VCC, its drain electrode connected to the drain of the N-channel transistor N1, and its gate electrode connected to the second input terminal 13. The discharge N-channel transistor N7 has its drain electrode connected to the base of the bipolar transistor Q2, its source electrode connected to the ground potential, and its gate electrode connected to the second input terminal 13. The discharge N-channel transistor N8 has its drain electrode connected to the base of the bipolar transistor Q1 via the resistor R, its source electrode connected to the ground potential, and its gate electrode connected to the second input terminal 13.

Only the differences in operation of FIG. 2 from that of FIG. 1 will now be described. When the enable signal $V_{EN}$ is in the high state, both of the P-channel transistor P5 and P6 will be rendered non-conductive and thus, both the bipolar transistors Q1 and Q2 will be turned off regardless of the state of the input logic signal applied to the first input terminal 12. As a result, the output voltage $V_O$ will be in a tri-state or "floating" state level. This tri-state level is approximately a mid-level voltage which is between the high state and the low state levels. The N-channel transistors N7 and N8 are both turned on when the enable signal $V_{EN}$ is in the high state so as to remove any storage charges from the bases of the respective transistors Q2 and Q1, thereby ensuring that they will be maintained in the turned-off condition. When the enable signal $V_{EN}$ is in the low state, both of the P-channel transistors P5 and P6 will be in the conductive states so as to apply the supply voltage VCC to the source of the P-channel transistor P3 and to the drain of the N-channel transistor N1. Accordingly, the operation of the buffer device 110 will be identical to that just previously described with respect to FIG. 1.

Figure 3:
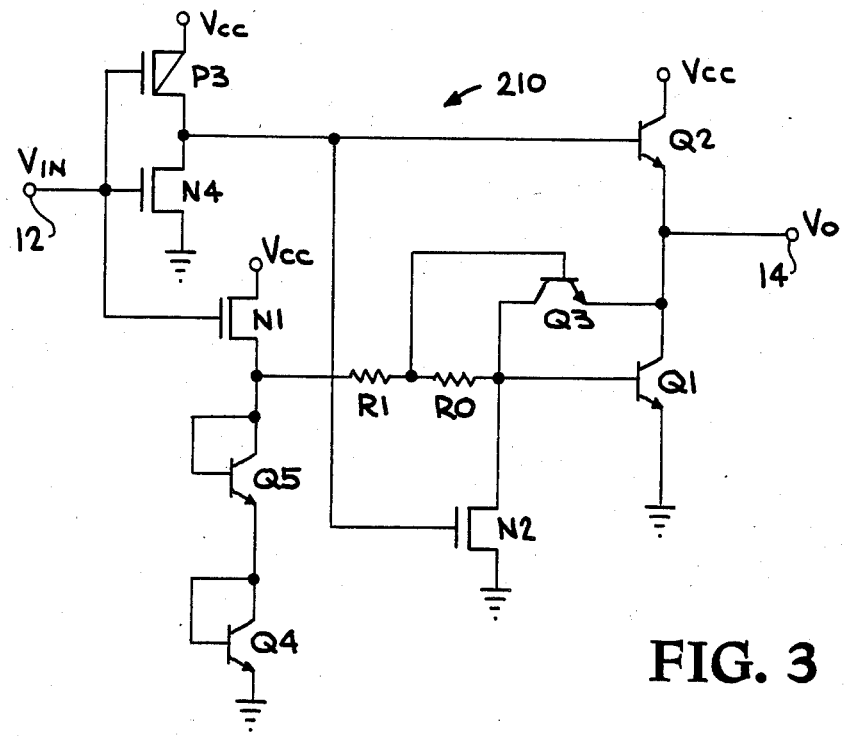
FIG. 3 is a second embodiment of the output buffer circuit of FIG. 1.

In FIG. 3, there is shown a second embodiment of the output buffer circuit of FIG. 1 which is designated by reference numeral 210. The output buffer circuit 10 of FIG. 1 has the disadvantage in that the output voltage in the low level state is controlled by the resistance value of the resistor R. The resistance value must be fabricated very precisely which increases manufacturing costs. Further, the buffer circuit 10 does not adequately compensate for the variations in the value of the resistance in the resistor R at high operating temperatures. The buffer circuit 210 is an improvement over the circuit of FIG. 1 and includes all of the components of FIG. 1 with the addition of bipolar transistors Q4, Q5 and a resistor R1. The components which are the same or function in the same way as those shown in FIG. 1 are given the same reference numerals and generally not described again.

The bipolar transistors Q4 and Q5 form a voltage source, and the resistor R1 and R form a voltage divider. The N-channel MOS transistor N2 has its drain connected to the base of the bipolar transistor Q1 and now functions as an active pull-down transistor so as to decease the low-to-high transition time at the output terminal 14. The gate and source electrodes of the transistor N2 are connected in the same manner as in FIG. 1. The collector and base of the diode-connected transistor Q4 are connected together and to the emitter of the transistor Q5. The emitter of the transistor Q4 is connected to the ground potential. The collector and base of the diode-connected transistor Q5 are connected together and further joined to the source of the first N-channel transistor N1 and to one end of the resistor R1. The other end of the resistor R1 is connected to the other end of the resistor R.

In operation, the output voltage in the low level state will now be controlled by the ratio of the resistors R1, R and by the base-to-emitter ($V_{BE}$) voltages of the transistors Q1, Q4, and Q5 which can be regulated more easily during the manufacturing process. In other words, when the input logic voltage $V_{IN}$ is in the high level state the transistor Q2 will be turned off and the voltage at the common collector-base of the transistor Q5 will arise to $V_{BE(Q4)} + V_{BE(Q5)}$. Accordingly, the voltage drop across the resistors R1 and R will be equal to $V_{BE(Q4)} + V_{BE(Q5)} - V_{BE(Q1)}$. The resistors R1 and R will act as a voltage divider to provide a controlled bias voltage across the collector-base junction of the transistor Q3. As a result, the output voltage at the output terminal 14 in the low level state will be maintained substantially constant. Since the circuit operation of FIG. 3 is identical to that described with respect to FIG. 1, a detailed discussion of its operation will not be repeated again.

Figure 4:
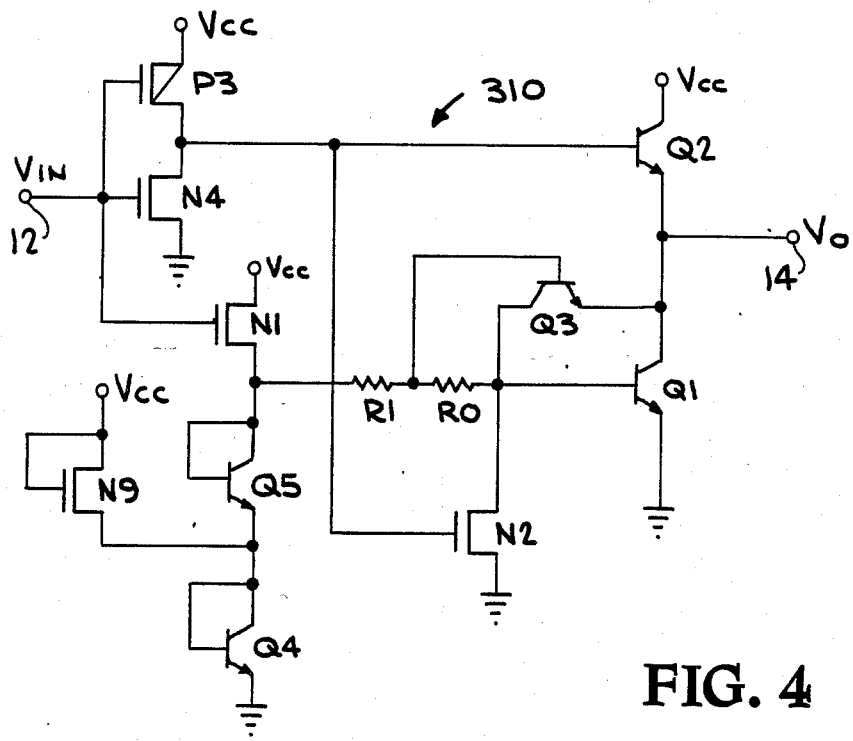
FIG. 4 is a third embodiment of the output buffer circuit of FIG. 1.

In FIG. 4, there is illustrated a third embodiment of the output buffer circuit of FIG. 1 which is designated by reference numeral 310. As can be seen, the output buffer circuit 310 comprises the circuit of FIG. 3 with an additional N-channel MOS transistor N9. The gate and drain electrodes of the transistor N9 are connected together and to the supply potential VCC. The source of the transistor N9 is connected to the collector of the transistor Q4 and to the emitter of the transistor Q5. The transistor N9 serves to a bleed resistor which maintains the base of the transistor Q4 and the emitter of the transistor Q5 always chrged, thereby reducing the amount of time required to turn on the pull-down bipolar transistor Q1. Except for this difference, the component connections and circuit operation of FIG. 4 is identical to the circuit of FIG. 3. It should be clearly understood by those skilled in the art that the transistor N9 may be replaced by either a P-channel MOS transistor or a resistor.

Figure 5:
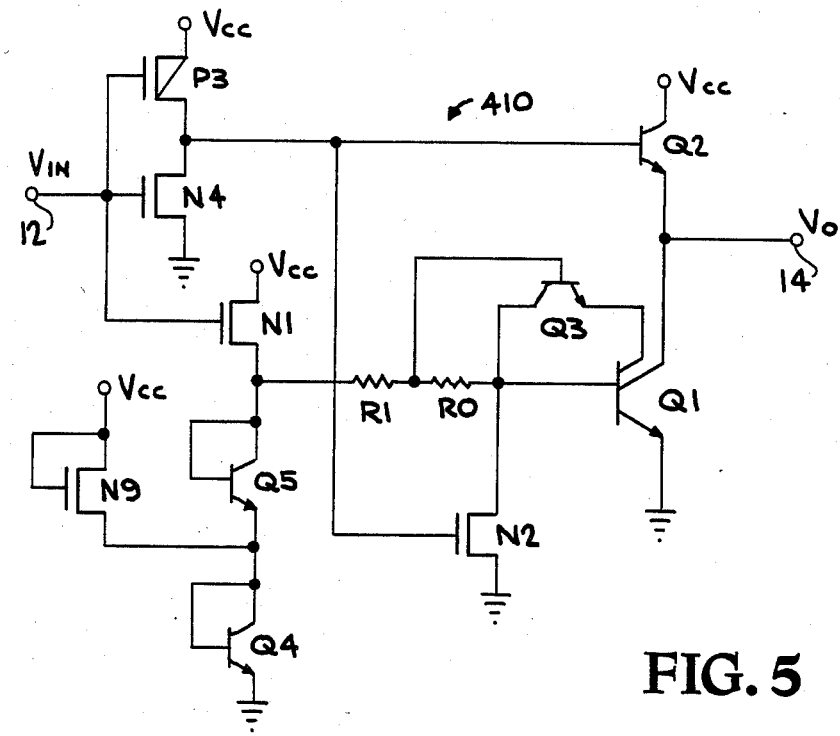
FIG. 5 is a fourth embodiment of the output buffer circuit of FIG. 1.

In FIG. 5, there is illustrated a fourth embodiment of the output buffer circuit of FIG. 1 which is designated by reference numeral 410. As can be seen, the output buffer circuit 410 is substantially identical to the circuit of FIG. 4 except the bipolar pull-down transistor Q1 is formed with dual collectors. One of the collectors of the transistor Q1 is connected to the output terminal 14, and the other collector of the transistor Q1 is connected to the emitter of the transistor Q3. The circuit of FIG. 4 has the disadvantage in that the sinking of current through the pull-down transistor Q1 during the time when the output voltage is in the low level state will cause a voltage drop to be developed across its collector-emitter terminals, thereby increasing the potential at the emitter of the transistor Q3 and reducing the clamp current in the transistor Q3. This increases the base current in the transistor Q1 which could cause the saturation of the transistor Q1. By the provision of dual collectors on the transistor Q1, the effect of the sinking of current from the output terminal 14 will be reduced so as to maintain a substantially constant low output voltage, yet maintaining the current level in the transistor Q3 to prevent saturation of the transistor Q1. Except for these differences, the component connections and circuit operation of FIG. 5 is identical to the circuit of FIG. 4.

Figure 6:
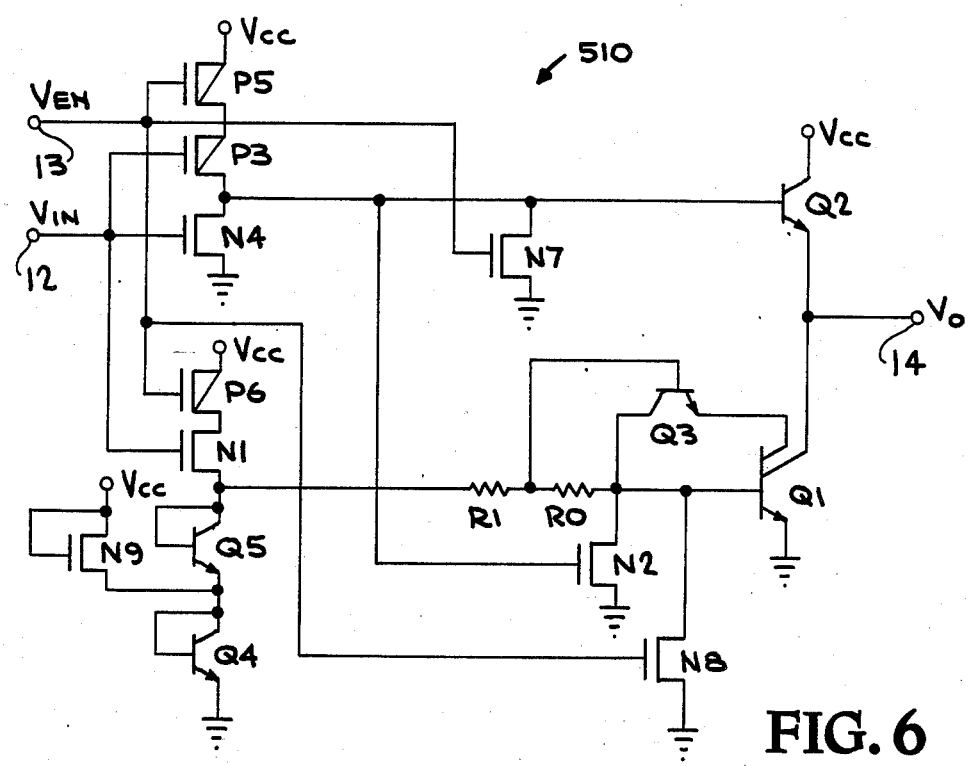
FIG. 6 is an alternate embodiment of the output buffer circuit of FIG. 2.

In FIG. 6, there is shown an alternate embodiment of the output buffer circuit of FIG. 2 which is designated by reference numeral 510. It will be noted that the buffer circuit 510 combines all of the circuit components in FIG. 2 with the additional improved features shown in FIG. 5. Specifically, the buffer circuit 510 incorporates the voltage source (Q4, Q5), the volage divider (R1, R), the bleed resistor (N9), and the transistor with dual collectors (Q1) from FIG. 5 into the circuit of FIG. 2. It can be seen that the N-channel MOS transistor N8 has its drain connected to the base of the bipolar transistor Q1 (rather than to the source of the transistor N1 as in FIG. 2) and now functions as an active pull-down transistor so as to decrease the transition time to the high output impedance state at the output terminal 14. Except for these differences, the component connections and the circuit operation of FIG. 6 is identical to the circuit of FIG. 2.

From the foregoing detailed description, it can thus be seen that the present invention provides output buffer circuits formed of merged bipolar transistors and CMOS transistors to produce two output states or three output states. The merged bipolar/CMOS output buffer circuits of the present invention have high current drive capabilities and low propogration delay.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope of thereof. Therefore, it is intended that this invention not be limited to the particular embodiments disclosed as the best modes contemplated for carrying out this invention, but that this invention will include all of the embodiments falling within the scope of the appended claims.

What is claimed is:

1. An output buffer circuit formed of merged bipolar transistors and CMOS transistors to provide two output states compatible with TTL levels comprising:
    a P-channel MOS transistor having its gate connected to an input terminal and its source connected to a supply potential;
    a first bipolar transistor having its collector connected to the supply potential, its base connected to the drain of said P-channel transistor, and its emitter connected to an output terminal;
    a first N-channel MOS transistor having its gate connected to the input terminal and its drain connected to the supply potential;
    a second bipolar transistor having its collector connected to the output terminal, its base connected to the source of said first N-channel transistor via a resistor, and its emitter connected to a ground potential;
    a second N-channel MOS transistor having its gate connected to the drain of said P-channel transistor, its drain connnected to the source of said first N-channel transistor, and its source connected to the ground potential;
    a third N-channel MOS transistor having its gate connected to the input terminal, its drain connected to the drain of said P-channel transistor, and its source connected to the ground potential; and
    a third bipolar transistor having its base connected to the source of said first N-channel transistor, its collector connected to the base of said second bipolar transistor, and its emitter connected to the collector of said second bipolar transistor.

2. An output buffer circuit as claimed in claim 1, wherein said first bipolar transistor is of an NPN-type conductivity.

3. An output buffer circuit as claimed in claim 1, wherein said second bipolar transistor is of an NPN-type conductivity.

4. An output buffer circuit as claimed in claim 1, wherein said buffer circuit is formed on a single silicon chip of a monolithic integrated circuit.

5. An output buffer circuit formed of bipolar transistors and CMOS transistors to provide two output states compatible with TTL levels comprising:
    a P-channel MOS transistor having its gate connected to an input terminal and its source connected to a supply potential;
    a first bipolar transistor having its collector connected to the supply potential, its base connected to the drain of said P-channel transistor, and its emitter connected to an output terminal;
    an N-channel MOS transistor having its gate connected to the input terminal and its drain connected to the supply potential;
    a second bipolar transistor having its collector connected to the output terminal, its base connected to the source of said N-channel transistor via a resistor, and its emitter connected to a ground potential;
    first discharge means operatively connected to the base of said first bipolar transistor for quickly turning off the same so as to speed up a low-to-high transition at the output terminal;
    second discharge means operatively connected to the base of said second bipolar transistor for quickly turning off same so as to speed up an high-to-low transition at the output terminal; and
    anti-saturation means connected between the base and collector of said second bipolar transistor for preventing said second bipolar transistor from being forced further into the saturation region.

6. An output buffer circuit as claimed in claim 5, wherein said first discharge means comprises an N-channel MOS transistor.

7. An output buffer circuit as claimed in claim 6, wherein said second discharge means comprises an N-channel MOS transistor.

8. An output buffer circuit as claimed in claim 7, wherein said anti-saturation means comprises a third bipolar transistor.

9. An output buffer circuit as claimed in claim 5, wherein said first bipolar transistor is of an NPN-type conductivity.

10. An output buffer circuit as claimed in claim 5, wherein said second bipolar transistor is of an NPN-type conductivity.

11. An output buffer circuit as claimed in claim 8, wherein said third bipolar transistor is of an NPN-conductivity.

12. An output buffer circuit as claimed in claim 5, wherein said buffer circuit is formed on a single silicon chip of a monolithic integrated circuit.

13. An output buffer circuit formed of merged bipolar transistors and CMOS transistors which provides three output states compatible with TTL levels comprising:
   a first P-channel MOS transistor having its gate connected to a first input terminal;
   a first bipolar transistor having its collector connected to a supply potential, its base connected to the drain of said first P-channel transistor, and its emitter connected to an output terminal;
   a first N-channel MOS transistor having its gate connected to the first input terminal;
   a second bipolar transistor having its collector connected to the output terminal, its base connected to the source of the first N-channel transistor via a resistor, and its emitter connected to a ground potential;
   a second N-channel MOS transistor having its gate connected to the drain of said first P-channel transistor, its drain connected to the source of said first N-channel transistor, and its source connected to the ground potential;
   a third N-channel MOS transistor having its gate connected to the first input terminal, its drain connected to the drain of said first P-channel transistor and its source connected to the ground potential;
   a third bipolar transistor having its base connected to the source of said first N-channel transistor, its collector connected to the base of said second bipolar transistor, and its emitter connected to the collector of said second bipolar transistor;
   a second P-channel MOS transistor having its gate connected to a second input terminal, its source connected to the supply potential, and its drain connected to the source of said first P-channel transistor;
   a third P-channel MOS transistor having its gate connected to the second input terminal, its source connected to the supply potential, and its drain connected to the drain of said first N-channel transistor;
   a fourth N-channel MOS transistor having its gate connected to the second input terminal, its drain connected to the drain of said first P-channel transistor, and its source connected to the ground potential; and
   a fifth N-channel MOS transistor having its gate connected to the second input terminal, its drain connected to the source of said first N-channel transistor, and its source connected to the ground potential.

14. An output buffer circuit as claimed in claim 13, wherein said first bipolar transistor is of an NPN-type conductivity.

15. An output buffer circuit as claimed in claim 13, wherein said second bipolar transistor is of an NPN-type conductivity.

16. An output buffer circuit as claimed in claim 13, wherein said buffer circuit is formed on a single silicon chip of a monolithic integrated circuit.

17. An output buffer circuit formed of merged bipolar transistors and CMOS transistor to provide two output states compatible with TTL levels comprising:
   a P-channel MOS transistor having its gate connected to an input terminal and its source connected to a supply potential;
   a first bipolar transistor having its collector connected to the supply potential, its base connected to the drain of said P-channel transistor, and its emitter connected to an output terminal;
   a first N-channel MOS transistor having its gate connected to the input terminal and its drain connected to the supply potential;
   a second bipolar transistor having its collector connected to the output terminal, its base connected to one end of a first resistor, and its emitter connected to a ground potential;
   a second N-channel MOS transistor having its gate connected to the drain of said P-channel transistor, its drain connected to the base of said second bipolar transistor, and its source connected to the ground potential;
   a third N-channel MOS transistor having its gate connected to the input terminal, its drain connected to the drain of said P-channel transistor, and its source connected to the ground potential;
   a third bipolar transistor having its base connected to the other end of the first resistor, its collector connected to the base of said second bipolar transistor, and its emitter connected to the collector of said second bipolar transistor;
   a second resistor having its one end connected to the source of said first N-channel transistor and its other end connected to the base of said third bipolar transistor; and
   a voltage source connected to the source of said first N-channel transistor.

18. An output buffer circuit as claimed in claim 17, wherein said voltage source comprises fourth and fifth bipolar transistors, the collectors and base of said fourth transistor being connected together and to the emitter of said fifth transistor, the emitter of said fourth transistor being connected to the ground potential, the collector and base of said fifth transistor being connected together and to the source of the first N-channel transistor.

19. An output buffer circuit as claimed in claim 18, further comprising a bleed resistor formed of a fourth N-channel MOS transistor having its drain and gate connected together and to the supply potential and having its source connected to the emitter of said fifth transistor.

20. An output circuit formed of merged bipolar transistors and CMOS transistor to provide two output states compatible with TTL levels comprising:
   a P-channel MOS transistor having its gate connected to an input terminal and its source connected to a supply potential;
   a first bipolar transistor having its collector connected to the supply potential, its base connected to the drain of said P-channel transistor, and its emitter connected to an output terminal;
   a first N-channel MOS transistor having its gate connected to the input terminal and its drain connected to the supply potential;

a second bipolar transistor having its first collector connected to the output terminal, its base connected to one end of a first resistor, and its emitter connected to a ground potential;

a second N-channel MOS transistor having its gate connected to the drain of said P-channel transistor, its drain connected to the base of said second bipolar transistor, and its source connected to the ground potential;

a third N-channel MOS transistor having its gate connected to the input terminal, its drain connected to the drain of said P-channel tansistor, and its source connected to the ground potential;

a third bipolar transistor having its base connected to the other end of the first transistor, its collector connected to the base of said second bipolar transistor, and its emitter connected to a second collector of said second bipolar transistor;

a second resistor having its one end connected to the source of said first N-channel transistor and its other end connected to the base of said third bipolar transistor; and a voltage source connected to the source of said first N-channel transistor.

21. An output buffer circuit as claimed in claim 20, wherein said voltage source comprises fourth and fifth bipolar transistors, the collector and base of said fourth transistor being connected together and to the emitter of said fifth transistor, the emitter of said fourth transistor being connected to the ground potential, the collector and base of said fifth transistor being connected together and to the source of the first N-channel transistor.

22. An output buffer circuit as claimed in claim 21, further comprising a bleed resistor formed of a fourth N-channel MOS transistor having its drain and gate connected together and to the supply potential and having its source connected to the emitter of said fifth transistor.

23. An output buffer circuit formed of merged bipolar transistors and CMOS transistors which provides three output states compatible with TTL levels comprising:

a first P-channel MOS transistor having its gate connected to a first input terminal;

a first bipolar transistor having its collector connected to a supply potential, its base connected to the drain of said first P-channel transistor, and its emitter connected to an output terminal;

a first N-channel MOS transistor having its gate connected to the first input terminal;

a second bipolar transistor having its first collector connected to the output terminal, its base connected to one end of a first resistor, and its emitter connected to a ground potential;

a second N-channel MOS transistor having its gate connected to the drain of said first p-channel transistor, its drain connected to the base of said second bipolar transistor, and its source connected to the ground potential;

a third N-channel MOS transistor having its gate connected to the first input terminal, its drain connected to the drain of said first P-channel transistor and its source connected to the ground potential;

a third bipolar transistor having its base connected to the other end of the first resistor, its collector connected to the base of said second bipolar transistor, and its emitter connected to a second collector of said second bipolar transistor;

a second resistor having its one end connected to the source of said first N-channel transistor and its other end connected to the base of said third bipolar transistor;

a second P-channel MOS transistor having its gate connected to a second input terminal, its source connected to the supply potential, and its drain connected to the source of said first P-channel transistor;

a third P-channel MOS transistor having its gate connected to the second input terminal, its source connected to the supply potential, and its drain connected to the drain of said first N-channel transistor;

a fourth N-channel MOS transistor having its gate connected to the second input terminal, its drain connected to the drain of said first P-channel transistor, and its source connected to the ground potential;

a fifth N-channel MOS transistor having its gate connected to the second input terminal, its drain connected to the base of said second bipolar transistor, and its source connected to the ground potential; and a voltage source connected to the source of said first N-channel transistor.

24. An output buffer circuit as claimed in claim 23, wherein said voltage source comprises fourth and fifth bipolar transistors, the collector and base of said fourth transistor being connected together and to the emitter of said fifth transistor, the emitter of said fourth transistor being connected to the ground potential, the collector and base of said fifth transistor being connected together and to the source of the first N-channel transistor.

25. An output buffer circuit as claimed in claim 24, further comprising a bleed resistor formed of a sixth N-channel MOS transistor having its drain and gate connected together and to the supply potential and having its source connected to the emitter of said fifth transistor.

* * * * *